(12) United States Patent
Yotsuya et al.

(10) Patent No.: US 7,033,665 B2
(45) Date of Patent: Apr. 25, 2006

(54) PRECISION MASK FOR DEPOSITION AND A METHOD FOR MANUFACTURING THE SAME, AN ELECTROLUMINESCENCE DISPLAY AND A METHOD FOR MANUFACTURING THE SAME, AND ELECTRONIC EQUIPMENT

(75) Inventors: Shinichi Yotsuya, Chino (JP); Takayuki Kuwahara, Suwa (JP)

(73) Assignee: Seiko Epson Corporation, (JP)

( * ) Notice: Subject to any disclaimer, the term of this patent is extended or adjusted under 35 U.S.C. 154(b) by 227 days.

(21) Appl. No.: 10/761,149

(22) Filed: Jan. 20, 2004

(65) Prior Publication Data

US 2004/0214449 A1 Oct. 28, 2004

(30) Foreign Application Priority Data

Jan. 20, 2003 (JP) .............................. 2003-011451

(51) Int. Cl.
*B32B 3/24* (2006.01)
(52) U.S. Cl. .................. 428/131; 216/12; 216/74; 216/79; 118/504; 430/5
(58) Field of Classification Search .............. 216/12, 216/74, 79; 428/131; 430/5; 118/504
See application file for complete search history.

(56) References Cited

U.S. PATENT DOCUMENTS

| | | | |
|---|---|---|---|
| 4,511,599 A | | 4/1985 | Rustomji |
| 5,520,297 A | * | 5/1996 | Kagami et al. ............... 216/12 |
| 6,376,096 B1 | * | 4/2002 | Pearson et al. ............ 428/596 |
| 6,603,159 B1 | * | 8/2003 | Atobe et al. ................ 257/280 |
| 2002/0111035 A1 | | 8/2002 | Atobe et al. |

FOREIGN PATENT DOCUMENTS

| | | |
|---|---|---|
| EP | 0219873 | 4/1987 |
| JP | 04/236758 | 8/1992 |
| JP | 09/162096 | 6/1997 |
| JP | 2000129419 | 5/2000 |
| JP | 2001023773 | 1/2001 |
| JP | 2001-185350 | 7/2001 |
| JP | 2001185350 | 7/2001 |

OTHER PUBLICATIONS

Communication from European Patent Office regarding counterpart application.

* cited by examiner

*Primary Examiner*—Shamim Ahmed
(74) *Attorney, Agent, or Firm*—Harness, Dickey & Pierce, P.L.C.

(57) ABSTRACT

A precision mask for deposition is provided that includes a first brace having a plurality of sections placed in parallel to each other at given intervals. The first brace forms portions that define a plurality of first openings. The precision mask for deposition also includes at least one second brace that is placed on the first brace so as to intersect with the first brace. The second brace forms portions that define a plurality of second openings. The second brace is joined to the first brace at a point where the second brace intersects with the first brace.

7 Claims, 10 Drawing Sheets

1: MASK SUBSTRATE
2: FIRST OPENINGS
3: FIRST BRACE
4: SECOND OPENINGS
5: SECOND BRACE

| PIXEL CONFIGURATION | SCHEMATIC DIAGRAM | TFT WIRING | IMAGE DISPLAY QUALITY | CHARACTER DISPLAY QUALITY |
|---|---|---|---|---|
| VERTICAL STRIPES | | SIMPLE | ○ | ○ |
| DELTA CONFIGURATION | | DIFFICULT | ○ | △ |
| SQUARE CONFIGURATION | | DIFFICULT | ○ | ○ |

FIG. 10

PRECISION MASK FOR DEPOSITION AND A METHOD FOR MANUFACTURING THE SAME, AN ELECTROLUMINESCENCE DISPLAY AND A METHOD FOR MANUFACTURING THE SAME, AND ELECTRONIC EQUIPMENT

BACKGROUND OF THE INVENTION

1. Field of the Invention

The present invention relates to a precision mask for deposition that is mainly used to form a hole transport layer, an emitting layer, and the like of an organic electroluminescence (EL) display, and a method for manufacturing the same. The invention also relates to the organic EL display, a method for manufacturing the same, and electronic equipment having the organic EL display.

2. Related Art

A conventional mask for deposition may be formed by wet-etching a single crystal silicon wafer of surface orientation (100) with potassium hydroxide or the like so as to reduce the thickness of the center of the wafer, and then by dry-etching the wafer to form an opening for deposition corresponding to each pixel of the organic EL display (see Japanese Unexamined Patent Application Publication No. 2001-185350, for example). The mask for deposition corresponds to the precision mask for deposition according to the invention.

A conventional mask for evaporation may be formed by wet-etching a single crystal silicon wafer of surface orientation (100) with potassium hydroxide or the like so as to reduce the thickness of part of the wafer, and by further wet-etching the wafer with potassium hydroxide or the like to form an evaporated pattern (an opening) (see Japanese Unexamined Patent Application Publication No. 4-236758, for example). The mask for evaporation corresponds to the precision mask for deposition according to the invention.

Figure 10:
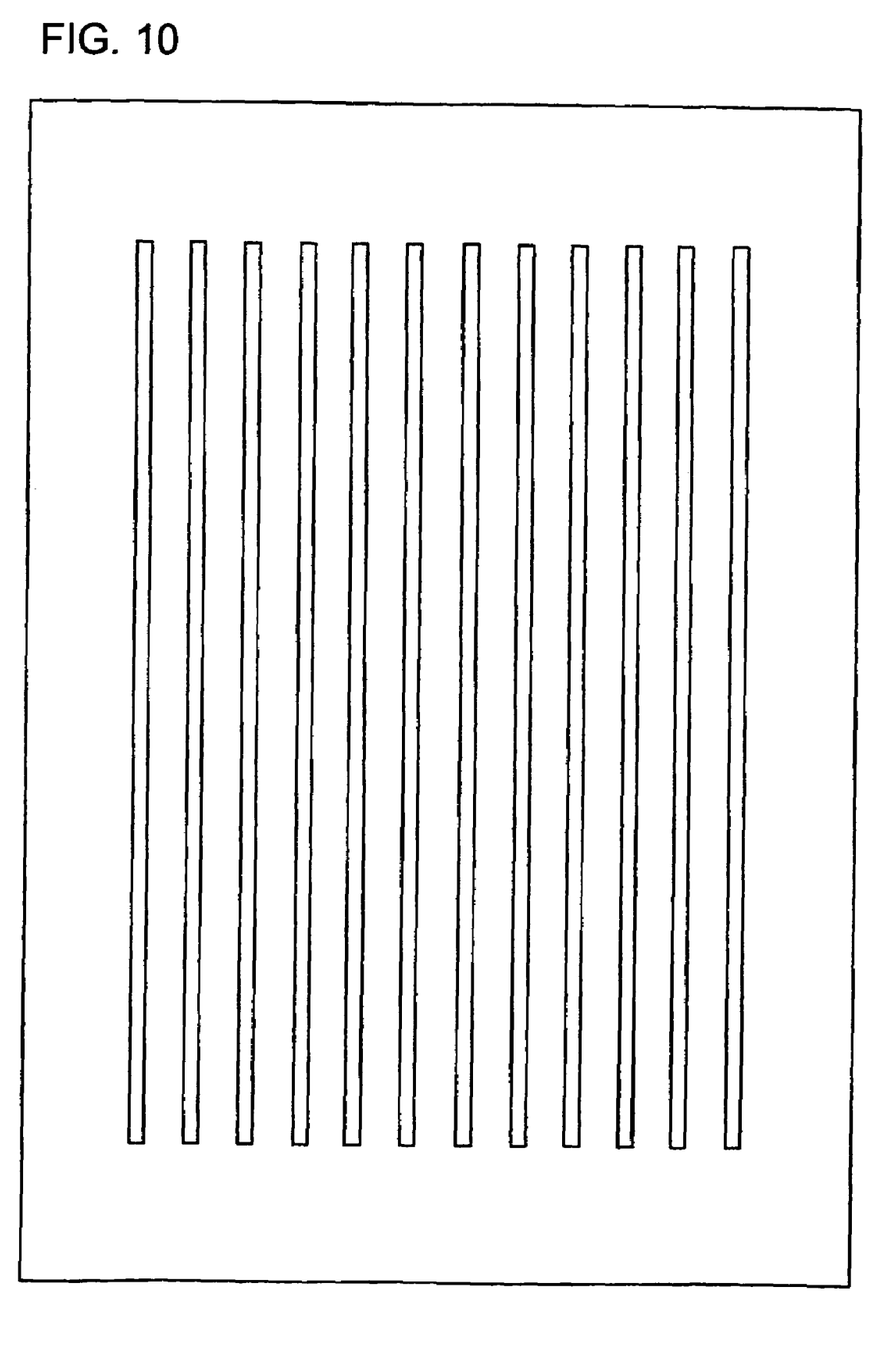
FIG. 10 is a drawing showing a conventional precision mask for deposition.

A conventional precision mask for deposition having a single crystal silicon wafer that is used for an organic EL display may include a plurality of elongated openings that are several dozen micrometers wide aligned as shown in FIG. 10. The openings make it possible to form pixels that are arranged lengthwise and each emit either red, green, or blue light.

The conventional mask for deposition having an opening for deposition corresponding to each pixel of the organic EL display (see Japanese Unexamined Patent Application Publication No. 2001-185350, for example) involves the following problem. It is necessary to align the mask for deposition with a glass substrate to which an emitting layer is evaporated within a tolerance of +/− five (5) micrometers both lengthwise and crosswise in a vacuum evaporation room. This hinders productivity.

The conventional mask for evaporation that is formed by wet-etching a single crystal silicon wafer of surface orientation (100) to form an opening (see Japanese Unexamined Patent Application Publication No. 4-236758, for example) also involves the following problem. If a plurality of elongated openings that are several dozen micrometers wide is aligned as shown in FIG. 10, part of the silicon wafer that is between two openings is too weak to withstand treatment. Thus, an evaporated wafer is not accurately patterned.

In consideration of these problems, the invention aims to provide a precision mask for deposition that is easily aligned with a glass substrate in evaporating an emitting layer and the like of an organic EL display, and is strong enough to form an accurate evaporated pattern. The invention also aims to provide a method for easily and accurately manufacturing such a precision mask for deposition, an organic EL display and a method for manufacturing the same, and electronic equipment including an organic EL display.

SUMMARY

A precision mask for deposition according to the invention includes a first brace including sections (e.g., ribs) placed parallel to each other at given intervals. The first brace forms portions that define a plurality of first openings. The precision mask for deposition also includes a second brace that is placed on the first brace so as to intersect with the first brace. The second brace forms portions that define a plurality of second openings. The second brace is joined to the first brace at a point where the second brace intersects with the first brace.

According to the invention, the second brace, which defines the second openings, serves as reinforcement for the first brace, which defines the first openings. The first openings are several dozen micrometers wide and several centimeters long, which are elongated in shape. Since the second brace is joined to the first brace and serves as reinforcement, the first brace does not bend. As a result, an accurate evaporated pattern can be provided. In addition, since the first openings are elongated in shape, the precision mask for deposition is easily aligned with the glass substrate when evaporating the emitting layer etc. as described in greater detail below.

The precision mask for deposition according to the invention also includes a mask substrate. The first brace and the second brace are formed to be joined to the mask substrate.

Since the first brace and the second brace are formed to be joined to the mask substrate, the precision mask for deposition according to the invention provides high accuracy and rigidity.

Also as regards the precision mask for deposition according to the invention, the mask substrate is made of single crystal silicon.

With the mask substrate that is made of single crystal silicon, the precision mask for deposition according to the invention provides high accuracy and rigidity. Moreover, the precision mask for deposition is easily manufactured by wet etching.

Also as regards the precision mask for deposition according to the invention having the mask substrate that is made of single crystal silicon, at least one of the side surfaces of the first brace and the second brace is of surface orientation (111).

Since at least one of the side surfaces of the first brace and the second brace is of surface orientation (111), the precision mask for deposition according to the invention is easily manufactured by anisotropic-etching the mask substrate that is made of single crystal silicon by potassium hydroxide or the like, when forming the first openings and the second openings.

Also as regards the precision mask for deposition according to the invention having the mask substrate that is made of single crystal silicon, the mask substrate is integrally made of single crystal silicon of surface orientation (110). At the same time, the side surfaces of the first brace are perpendicular (111) to surface orientation (110) of the mask substrate, and the side surfaces of the second brace, which intersects with the first brace, are also perpendicular (111) to surface orientation (111) of the mask substrate.

According to the invention, the second brace, which defines the second openings of the mask substrate, serves as reinforcement for the first brace, which defines the first openings of the mask substrate. Since the second brace is joined to the first brace and serves as reinforcement, the first brace does not bend. As a result, an accurate evaporated pattern can be provided. Since both of the side surfaces of the first brace and the second brace are of surface orientation (111), the precision mask for deposition is easily manufactured by wet-etching a silicon wafer by potassium hydroxide or the like, when forming the first openings and the second openings.

Also as regards the precision mask for deposition according to the invention, oxygen concentration of the mask substrate that is made of a single crystal silicon wafer is $1.7*10^{18}$ atm/cm$^3$ or below.

The invention provides a precision mask for deposition that provides higher accuracy by using a single crystal silicon wafer whose oxygen concentration is low, which can avoid developing a crystal defect when the mask substrate reaches a high temperature in manufacturing the precision mask for deposition.

A method for manufacturing the precision mask for deposition according to the invention includes the following steps: forming an etching protective film on the mask substrate that is made of single crystal silicon; patterning configurations corresponding to the plurality of first openings, which is defined by the first brace on the back of the mask substrate, on the etching protective film; and patterning configurations corresponding to the plurality of second openings, which is defined by the second brace on the surface of the mask substrate, on the etching protective film. The method also includes the steps of removing the etching protective film in parts that are patterned and forming the first openings and the second openings by etching.

According to the invention, the etching protective film is formed on both the surface and the back of a single crystal silicon wafer. The single crystal silicon wafer is then patterned by photolithography or the like and removed in parts that are patterned, which is to be the openings by anisotropic etching. With the method including these steps, a precision mask for deposition that can form an accurate evaporated pattern is easily and accurately manufactured.

Also as regards the method for manufacturing the precision mask for deposition according to the invention, the step of forming the etching protective film on the mask substrate that is made of single crystal silicon also includes the following steps: heating the mask substrate up to 500° C. or higher; cooling the mask substrate; and if the temperature of the mask substrate is from 500 to 800° C., cooling the mask substrate at an average cooling rate of at least 3° C. per minute.

If the temperature of the mask substrate is from 500 to 800° C., it is possible to quickly pass through this temperature range in which a crystal defect is most likely to develop by cooling the mask substrate at an average cooling rate of at least 3° C. per minute makes. Thus the precision mask for deposition according to the invention provides higher accuracy.

Also as regards the method for manufacturing the precision mask for deposition according to the invention, the step of forming the etching protective film on the mask substrate that is made of single crystal silicon also includes the following steps: forming the etching protective film by thermal oxidation; cooling the mask substrate; and if the temperature of the mask substrate is from 500 to 800° C., cooling the mask substrate at an average cooling rate of at least 3° C. per minute.

If the temperature of the mask substrate is from 500 to 800° C., it is possible to quickly pass through this temperature range in which a crystal defect is most likely to develop by cooling the mask substrate at an average cooling rate of at least 3° C. per minute makes. Thus the precision mask for deposition according to the invention provides higher accuracy.

An EL display according to the invention includes the precision mask for deposition mentioned above.

Since the EL display according to the invention is manufactured with the precision mask for deposition, which provides high accuracy and is easily aligned with the glass substrate when evaporating the emitting layer etc. as described above, the EL display offers high quality with an accurate evaporated pattern.

A method for manufacturing the EL display according to the invention includes the step of placing the precision mask for deposition mentioned above at a predetermined position on the glass substrate so as to form an EL layer.

Since the EL display according to the invention is manufactured with the precision mask for deposition, which provides high accuracy and is easily aligned with the glass substrate when evaporating the emitting layer etc. as described above, the EL display offers high quality with an accurate evaporated pattern.

Furthermore, the method for manufacturing the EL display is simple, which can reduce cost.

Electronic equipment having the EL display according to the invention includes an EL layer that is manufactured with the precision mask for deposition mentioned above.

The electronic equipment having the EL display according to the invention includes the EL display, which offers high quality with an accurate evaporated pattern. Furthermore, since the method for manufacturing the EL display is simple, cost can be reduced.

DETAILED DESCRIPTION

First Embodiment

Figure 1:
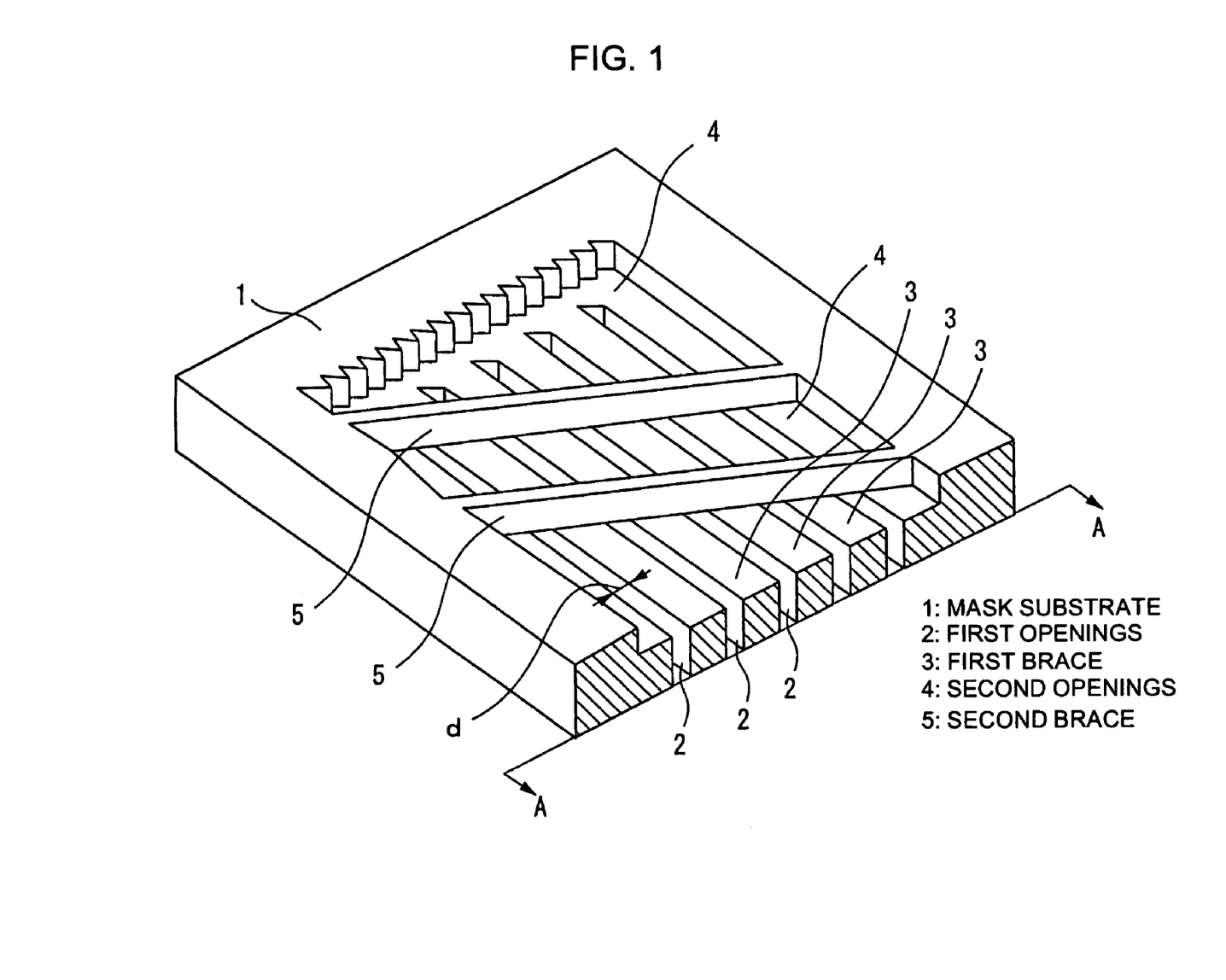
FIG. 1 is a diagram schematically showing a precision mask for deposition according to a first embodiment of the invention.

FIG. 1 is a diagram schematically showing a precision mask for deposition according to a first embodiment of the invention. The mask is cut along the A—A line in FIG. 1, and portions of the mask not shown in this diagram are formed in the same pattern. A mask substrate 1 is provided by cutting a single crystal silicon wafer into a rectangle. Facing the back of the mask substrate 1, a first brace 3 is provided. In this diagram the first brace 3 includes a plurality of braces that are placed in parallel to each other at given intervals. The intervals are a plurality of first openings 2. Facing the surface of the mask substrate 1, a second brace 5 is provided. In this diagram the second brace 5 includes a plurality of braces that form a plurality of second openings 4. The first brace 3 and the second brace 5 are formed to be joined to the mask substrate 1, which is made of single crystal silicon. A method for manufacturing them is described below in a third embodiment. At a point where the first brace 3 intersects with the second brace 5, the upper surface of the first brace 3 is joined to the lower surface of the second brace 5. When evaporating an organic EL material, the first brace 3 is in contact with the evaporated material.

FIG. 1 schematically shows the precision mask for deposition. In general, the width "d" of the first openings 2 is from several micrometers to several dozen micrometers. The first brace 3 is about twice as wide as the first openings 2. The length of the first openings 2 is, in general, from several centimeters to several dozen centimeters. Thus the first openings 2 are elongated in shape.

The precision mask for deposition according to the first embodiment shown in FIG. 1 is formed by cutting the mask substrate 1 out of a single crystal silicon wafer of surface orientation (110). The side surfaces of the first brace 3 are perpendicular (111) to the surface orientation (110) of the mask substrate. The side surfaces of the second brace 5 intersect with the side surfaces of the first brace 3, and are also perpendicular (111) to the surface orientation of the mask substrate. Here, the side surfaces of the braces face neither the surface and the back of the mask substrate 1, nor the first and second openings. The precision mask for deposition is provided by, for example, cutting a single crystal silicon wafer of surface orientation (110) into a rectangle, which is to be the mask substrate 1. The first openings 2 and the second openings 4 is easily formed by anisotropic etching with potassium hydroxide or the like. A method for manufacturing the precision mask for deposition according to the invention is described below in greater detail in a second embodiment.

It should be noted that although the side surfaces of the first brace 3 and the second brace 5 are perpendicular to the surface of the mask substrate 1 in the first embodiment, it is not always necessary to form the side surfaces of the braces perpendicular to the surface of the mask substrate. For example, if the first brace 3 is formed so as to have a trapezoidal cross-section, the first openings 2 have an inverted trapezoidal cross-section. This makes it possible to evaporate a material with a wide angle.

Furthermore, the first brace 3 may be made of a different material from that of the second brace 5.

Figure 2:
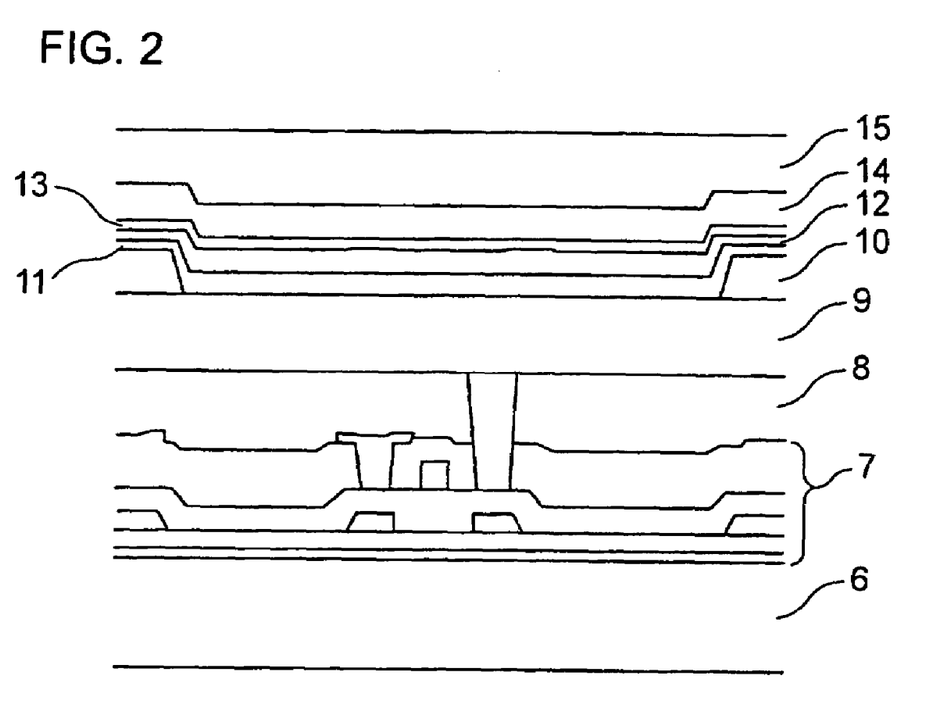
FIG. 2 is a cross-section view of an electrode part of an organic EL display according to the invention.

FIG. 2 is a cross-section view of an electrode part of an organic EL display that is an example of an EL display manufactured with the precision mask for deposition according to the first embodiment of the invention. The diagram shows that a glass substrate 6 is provided at the bottom. On the substrate, a TFT wiring layer 7, a planarizing insulating film 8, and an ITO layer 9 are deposited in this order. ITO stands for indium thin oxide that serves as an anode to apply an electric current to the pixels. Then a silicon oxide layer 10 is deposited on a part that emits no light around each pixel. Subsequently, a hole transport layer 11, an emitting layer 12, and an electron injection layer 13, all of which form an EL layer and are made of an organic EL material, are deposited by, for example, vacuum evaporation. On top of them, an ITO layer 14 that serves as a cathode and a transparent sealant film 15 are deposited. The precision mask for deposition shown in FIG. 1 is mainly used as a mask for evaporating the hole transport layer 11, the emitting layer 12, and the electron injection layer 13. In addition, the mask can be used as a mask for sputtering when forming the ITO layer 9 by sputtering. The EL layer may include a hole injection layer and the like if any, as well as the hole transport layer 11, the emitting layer 12, and the electron injection layer 13.

The precision mask for deposition (the mask substrate 1) according to the first embodiment includes the second brace 5 that is joined to the first brace 3. Therefore, the mask is strong enough to withstand treatment and forms an accurate evaporated pattern. Also as regards the precision mask for deposition according to the first embodiment, as shown in a fourth embodiment described later in detail, the emitting layer 12 etc. are deposited while the first openings 2, which are elongated in shape, are aligned with a portion on the glass substrate 6 where pixels are formed. This makes it easy to align the mask substrate 1 with the glass substrate 6, which can improve production efficiency.

Also according to the first embodiment, the side surfaces of the first brace 3 and the second brace 5 are perpendicular (111) to the mask substrate 1. This makes it easy to form the precision mask for deposition by anisotropic etching with potassium hydroxide or the like. In addition, since the side surfaces of the first brace 3 are perpendicular to the mask substrate 1, the first openings 2 can be formed precisely.

Second Embodiment

FIG. 3 shows cross-section views of the mask substrate 1 illustrating a method for manufacturing the precision mask for deposition according to the first embodiment. First, the mask substrate 1 is provided by cutting a single crystal silicon wafer of surface orientation (110) into a rectangle. After cleaning the mask substrate 1, an etching protective film 17 that is made of silicon oxide ($SiO_2$) is formed by thermal oxidation so as to surround the mask substrate 1 (see FIG. 3(a)). The etching protective film 17 may be obtained by forming a silicon nitride film by chemical vapor deposition (CVD) or forming a gold-chrome alloy film by sputtering instead of by forming a silicon oxide film by thermal oxidation.

According to the second embodiment, single crystal silicon whose oxygen concentration is $1.7*10^{18}$ atm/cm$^3$ or below is used for the mask substrate 1. If the temperature of the mask substrate 1 is from 500 to 800° C. after forming the etching protective film 17 by thermal oxidation, the mask substrate 1 is cooled at an average cooling rate of at least 3° C. per minute.

Figure 3A:
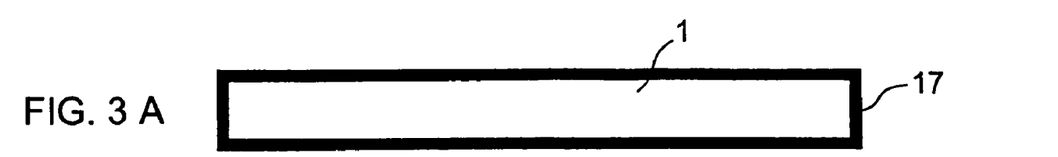
FIGS. 3A–3D are diagrams showing a method for manufacturing a precision mask for deposition according to the invention.
Figure 4:
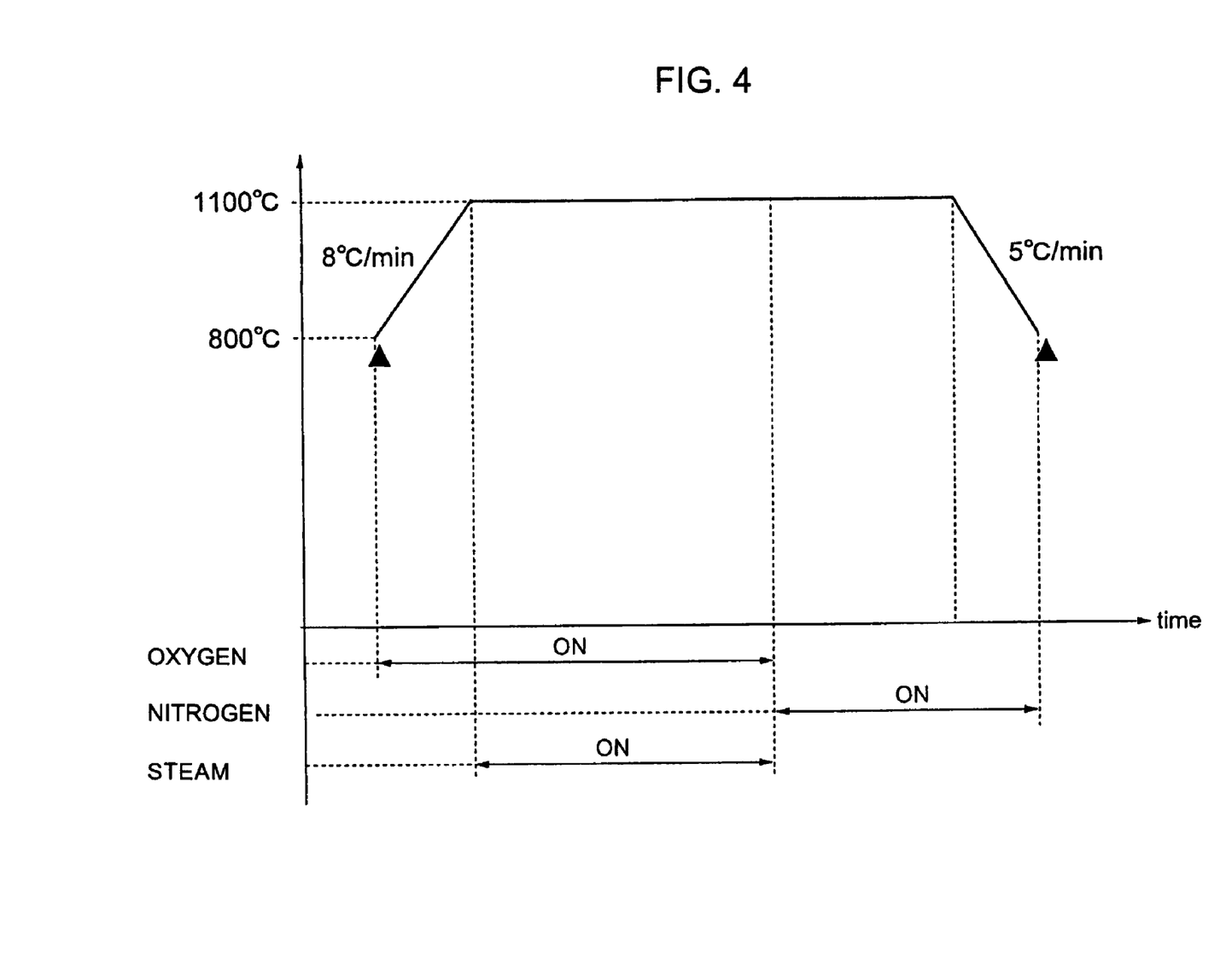
FIG. 4 is a chart showing temperature changes by thermal oxidation shown in FIG. 3A.

FIG. 4 is a chart showing an example of temperature changes in forming the etching protective film 17 by thermal oxidation as shown in FIG. 3A. When the temperature reaches 800° C., the temperature is increased up to 1100° C. by supplying oxygen to a thermal oxidation room. When the temperature reaches 1100° C., steam is supplied to the thermal oxidation room in order to accelerate thermal oxidation. When thermal oxidation is completed after keeping the temperature of 1100° C. for a while, nitrogen is supplied in order to stabilize the etching protective film 17. Then, the temperature is lowered from 1100° C.

If the temperature of the mask substrate 1 is from 500 to 800° C., the mask substrate 1 is cooled at an average cooling rate of at least 3° C. per minute. This is because the possibility of developing a crystal defect of single crystal silicon is highest in this temperature range. If the mask substrate 1 has a crystal defect, openings may not be accurately formed by anisotropic etching. Developing such a crystal defect can be avoided by passing through this temperature range quickly.

The mask substrate also reaches a temperature of 500° C. or higher when forming the etching protective film 17 of silicon nitride by CVD or the etching protective film 17 of gold-chrome alloy by sputtering instead of thermal oxidation. Also in these cases, if the temperature of the mask substrate is from 500 to 800° C., developing a crystal defect can be avoided by cooling the mask substrate at an average cooling rate of at least 3° C. per minute.

Furthermore, by using single crystal silicon whose oxygen concentration is $1.7*10^{18}$ atm/cm$^3$ or below for the mask substrate 1, developing a crystal defect caused by a higher-temperature process can be avoided. It is known that a crystal defect rarely grows under the above-mentioned conditions, that is, applying the average cooling rate of at least 3° C. per minute if the temperature is from 500 to 800° C. and using single crystal silicon whose oxygen concentration is $1.7*10^{18}$ atm/cm$^3$ or below for the mask substrate 1.

Figure 5:
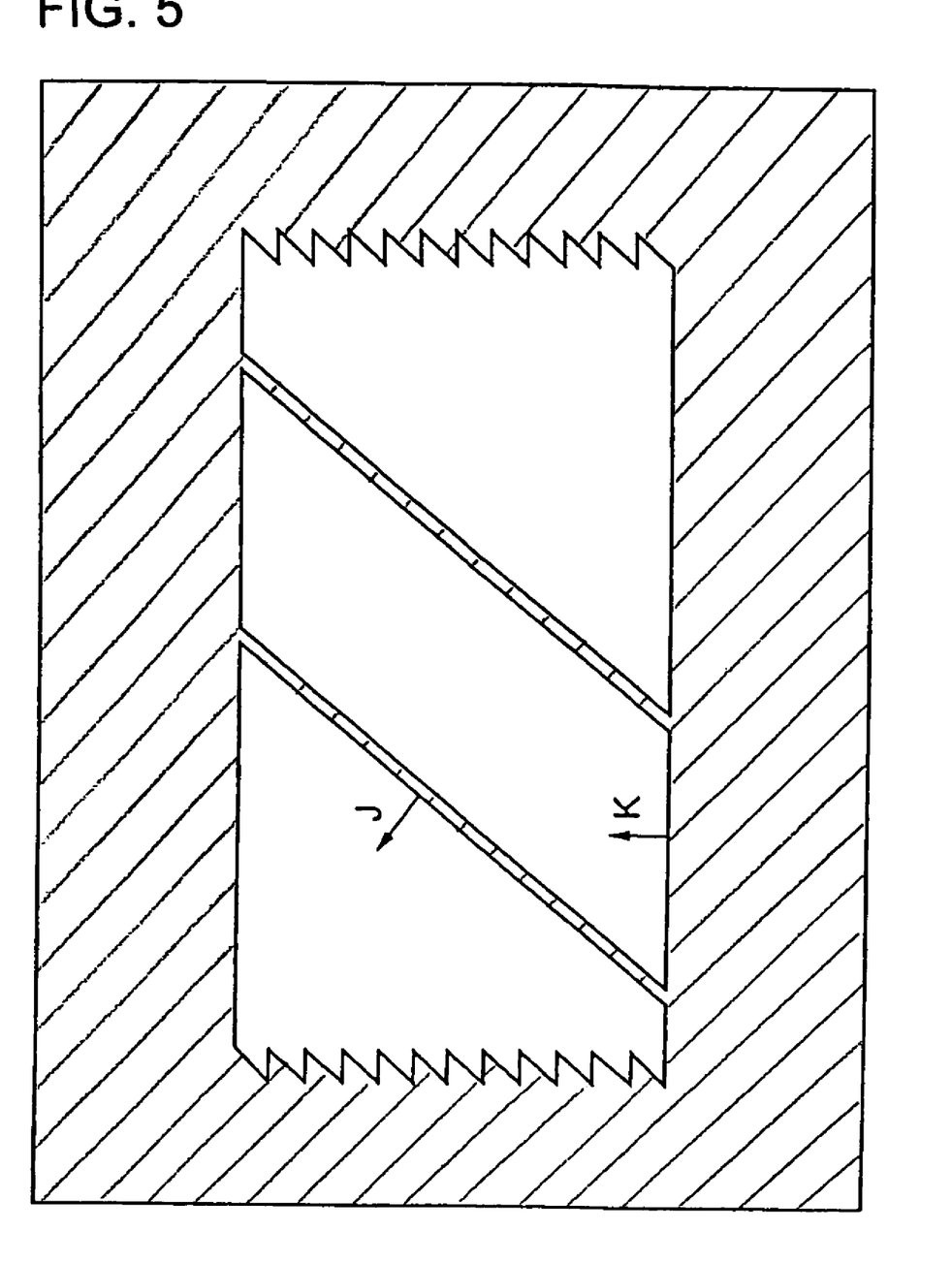
FIG. 5 is a drawing showing a pattern on the surface of the mask substrate.
Figure 6:
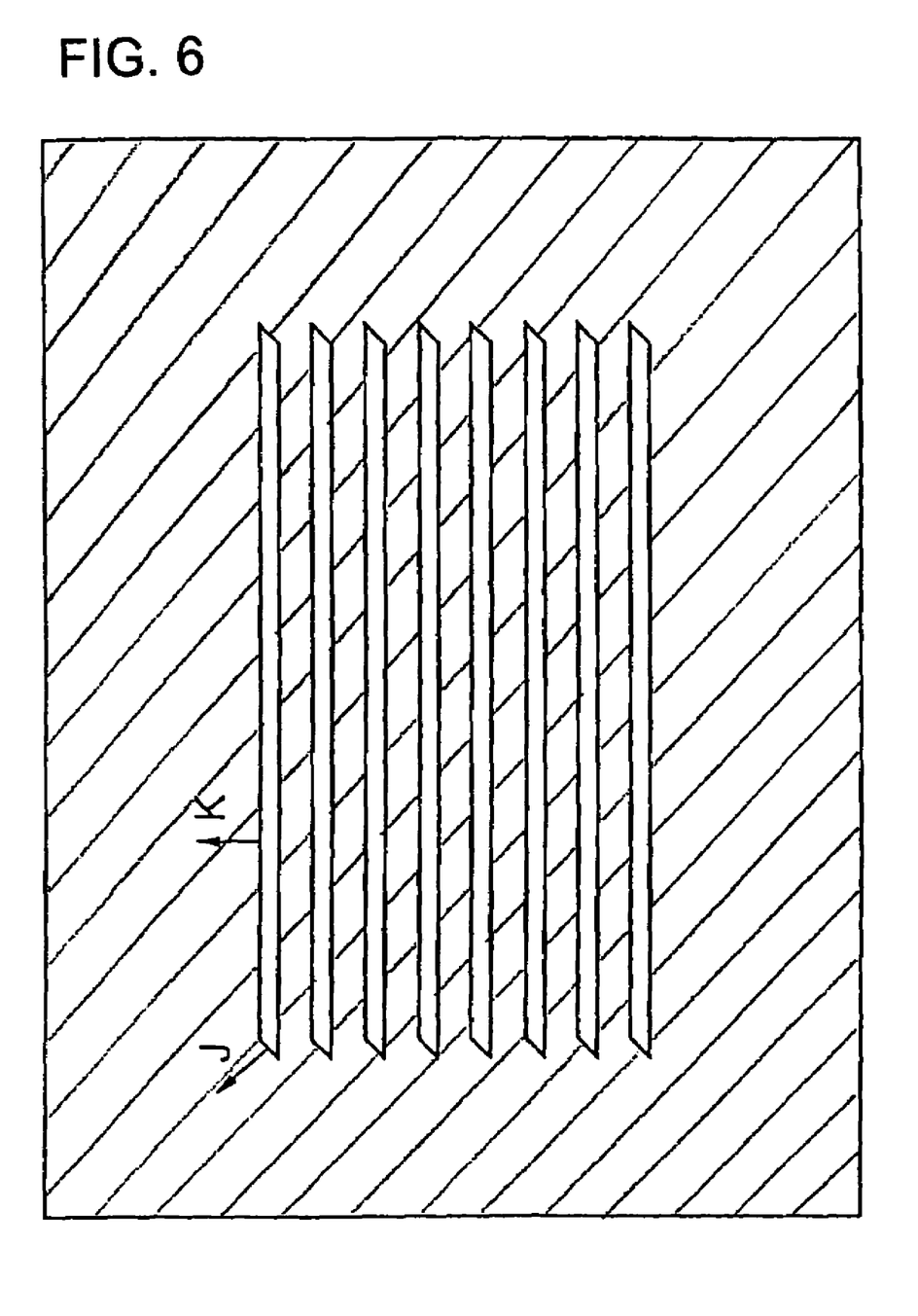
FIG. 6 is a drawing showing a pattern on the back of the mask substrate.

Next, configurations corresponding to the first openings 2 that are defined by the first brace 3 are patterned on the back of the mask substrate 1 where the etching protective film 17 is formed. Also, configurations corresponding to the second openings 4 that are defined by the second brace 5 are patterned on the surface of the mask substrate. The configurations are patterned by photolithography on portions other than the openings. FIG. 5 shows a pattern on the surface of the mask substrate 1, while FIG. 6 shows a pattern on the back of the mask substrate 1. Photolithography is performed in the grayed areas in FIGS. 5 and 6. Here, the arrows "J" and "K" in FIGS. 5 and 6 are in the direction of (111). Then the mask substrate 1 on which the configurations are patterned is etched by a solution of hydrofluoric acid and ammonium fluoride so as to remove the etching protective film in parts to be the openings (see FIG. 3B). Here, a part to be an alignment mark 20 that is necessary when setting a position of evaporating the emitting layer 12 etc. of the organic EL display that is mentioned in the first embodiment is also etched.

Figure 3B:
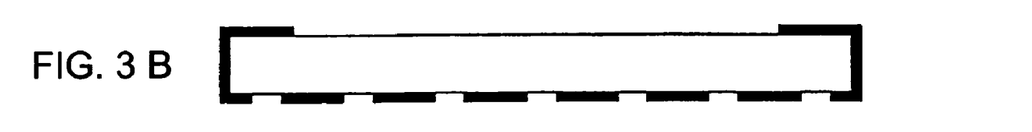
Figure 3C:
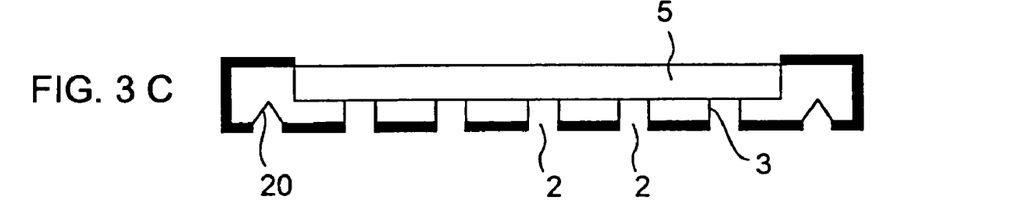

The mask substrate 1 that is etched as shown in FIG. 3B is then anisotropic-etched with a potassium hydroxide solution so as to form the first openings 2 and the second openings 4 (see FIG. 3C). By wet etching with potassium hydroxide, part of the mask substrate that is not covered by silicon oxide is etched accurately with the side surfaces of surface orientation (111). When the organic EL display includes a semiconductor, organic alkaline solutions such as a tetramethylammonium hydroxide solution are preferably used for etching, instead of the potassium hydroxide solution. This is because the semiconductor may be contaminated by potassium. Also in this case, anisotropic etching can be performed as is the case with potassium hydroxide.

Figure 3D:
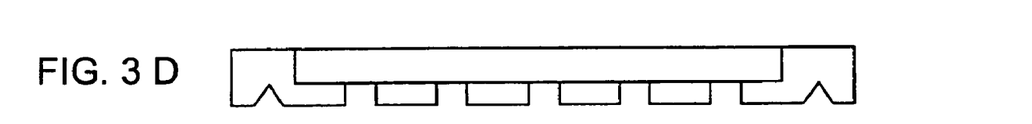

Finally, the etching protective film 17 that remains on the mask substrate 1 shown in FIG. 3C is removed by a buffer hydrogen fluoride solution or the like. As a result, the precision mask for deposition is formed (see FIG. 3D).

By performing anisotropic etching after forming the etching protection film, the method for manufacturing a precision mask for deposition according to the second embodiment makes it possible to easily and accurately manufacture a precision mask for deposition that is strong enough to form an accurate evaporated pattern as shown in FIG. 1. Moreover, by cooling the mask substrate 1 at an average cooling rate of 3° C. per minute if the temperature is from 500 to 800° C. so as to quickly pass through this temperature range in which a crystal defect is likely to develop, and by using single crystal silicon whose oxygen concentration is $1.7*10^{18}$ atm/cm$^3$ or below for the mask substrate 1, the method makes it possible to avoid developing a crystal defect and thereby to accurately perform anisotropic etching.

Third Embodiment

The electrode part of an organic EL display whose EL layer is manufactured with the precision mask for deposition according to the first embodiment of the invention has a cross section as shown in FIG. 2. An electrode configuration as viewed from the surface side of an EL display according to a third embodiment is called vertical stripes. Three major electrode configurations for an organic EL display are described below.

Figure 7:
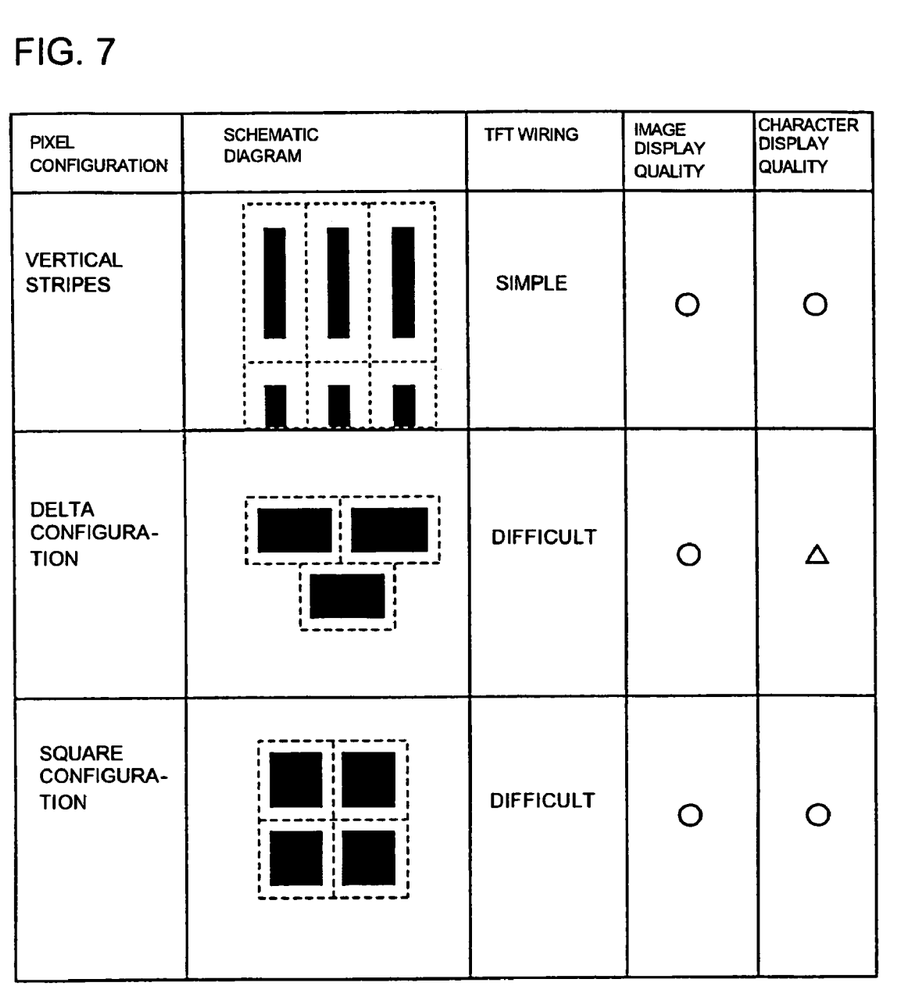
FIG. 7 is a comparison chart of electrode configurations for an organic EL display.

FIG. 7 is a comparison chart of the electrode configurations for an organic EL display in terms of the difficulty of thin-film transistor (TFT) wiring, image display quality, and character display quality. TFT wiring means general wiring for driving an organic EL display. It controls switching on and off of each pixel. Electrode configurations have an important influence on display quality, in particular, as regards a full-color low-molecular organic EL display. As shown in FIG. 7, a configuration called delta configuration has the disadvantages of complicated TFT wiring and low character display quality. A configuration called square configuration also has the disadvantages of rather complicated TFT wiring and high cost. In the configuration called vertical stripes, pixels whose width is 20 and length is 60 micrometers, for example, are arranged. An organic EL display of vertical stripes requires simple TFT wiring and low cost, while it provides high image and character display quality.

Since the precision mask for deposition shown in FIG. 1 includes the first openings 2 that are elongated in shape, it is suitable for manufacturing the organic EL display of vertical stripes.

Since the EL display according to the third embodiment is manufactured with the precision mask for deposition according to the first embodiment shown in FIG. 1, which is sufficiently strong, the display provides high precision with accurate pixel patterns. In addition, since the display adopts the vertical-stripe pixel configuration, it requires simple TFT wiring and low costs, while it provides high image and character display quality.

Fourth Embodiment

Figure 8:
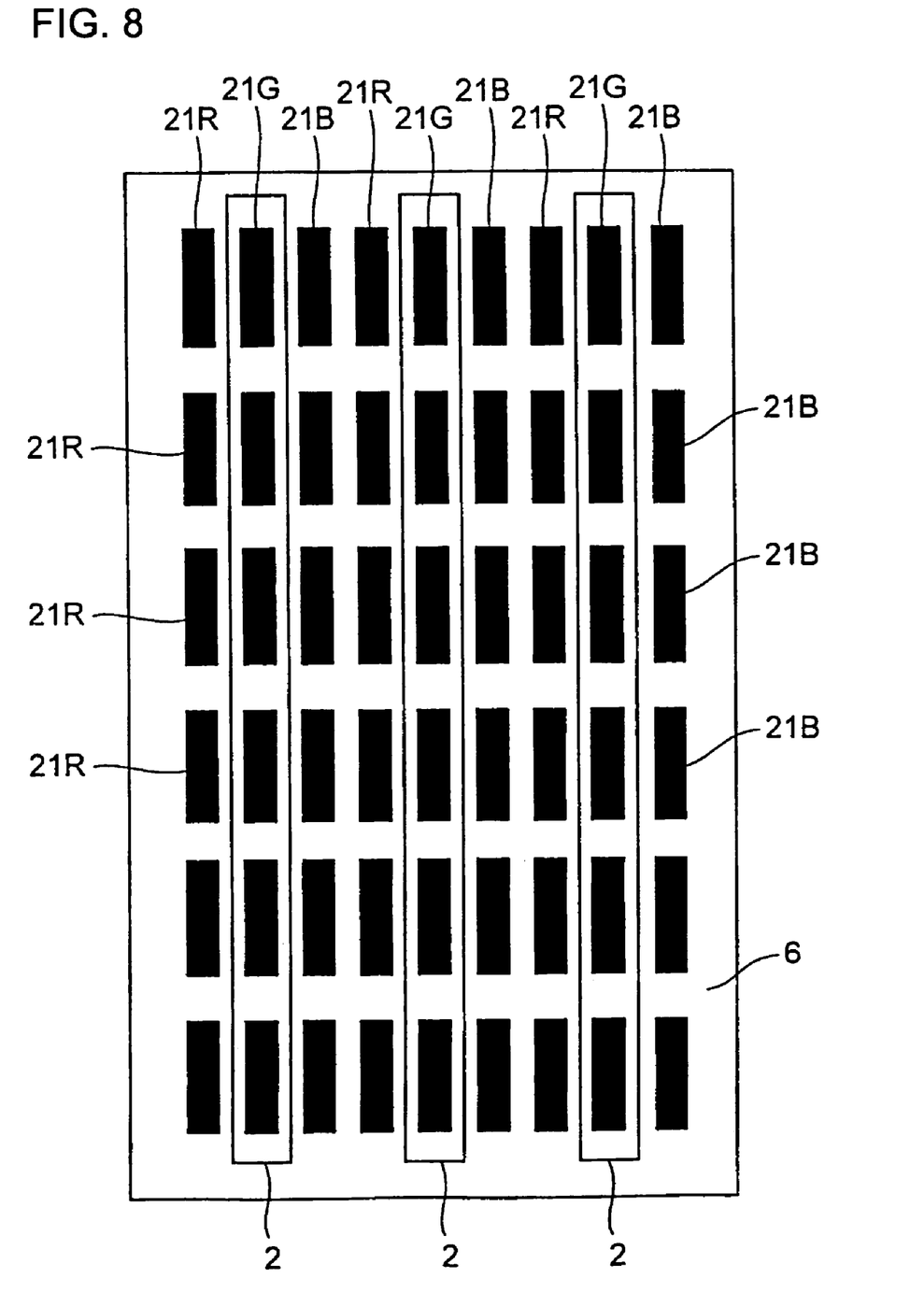
FIG. 8 is a drawing showing the spatial relationship of the glass substrate and the precision mask for deposition when using evaporation.

FIG. 8 shows the spatial relationship of the glass substrate 6 and the precision mask for deposition (the mask substrate 1) when vacuum-evaporating the EL layer to the organic EL display shown in FIG. 2 in manufacturing the organic EL display. The organic EL display shown in FIG. 8 adopts the vertical-stripe pixel configuration. The TFT wiring layer 7, the planarizing insulating film 8, the ITO layer 9, and the silicon oxide layer 10 are deposited on the glass substrate 6. The mask substrate 1 (not shown in the diagram) is provided in a manner that its back (the side on which the first openings 2 are formed) is in contact with the glass substrate 6. As shown in FIG. 8, the first openings 2 are aligned with vertical lines of pixels. In addition, an evaporation source is on the side of the mask substrate 1. The first openings 2 are designed so as to provide an opening every three vertical pixel lines and evaporate pixels that emit the same color at a time. In other words, red pixels 21R, green pixels 21G, and blue pixels 21B are each arranged lengthwise. Pixels of a desired color are evaporated only by moving the mask substrate 1 to the line of pixels of the color and aligning the mask substrate 1 with the glass substrate 6.

Above the mask substrate 6, the silicon oxide layer 10, which is an insulator, is deposited on a part that emits no light around each pixel as shown in FIG. 2. Thus, even if the EL layer is formed over the first openings 2, pixels are separated one another. When vacuum-evaporating the emitting layer 12 etc., it is therefore sufficient to pay attention only to lateral alignment accuracy and not to longitudinal alignment accuracy when aligning the mask substrate 1 with the glass substrate 6. Since the mask substrate 1 is aligned with the glass substrate 6 in a vacuum evaporation room, achieving high longitudinal and alignment accuracies requires time and money, and reduces production efficiency as a result.

However, using the precision mask for deposition (the mask substrate 1) shown in FIG. 1 makes it easy to align the mask substrate 1 with the glass substrate 6, which improves production efficiency. In addition, since the first openings 2 are elongated in shape, the mask is suitable for manufacturing the organic EL display of vertical-stripe pixel configuration.

In order to reduce the need for high longitudinal alignment accuracy as mentioned above, one option is to use such a mask for evaporation as one shown in FIG. 10. The problem here is that braces between elongated openings are several dozen micrometers wide in general, which are too weak to withstand treatment. This means it is difficult to make an accurate evaporated pattern. The precision mask for deposition shown in FIG. 1, however, includes at least one of the second brace 5, which is joined to the first brace 3. Thus, the first brace 3 does not easily bend.

Here, the emitting layer 12 etc. may not be evaporated evenly because of the second brace 5. To solve this problem, thickness distribution is evenly balanced within a pixel by rotating the glass substrate 6 and the mask substrate 1 together in a vacuum evaporation room and moving an evaporation source as required.

Furthermore, as regards the method for manufacturing an EL display according to the fourth embodiment, the emitting layer 12 etc. are deposited while the first openings 2, which are elongated in shape, are aligned with a portion on the glass substrate 6 where pixels are formed. This makes it easy to align the mask substrate 1 with the glass substrate 6, which can improve production efficiency. Moreover, since the precision mask for deposition (the mask substrate 1) according to the first embodiment includes the second brace 5, the mask is strong enough to withstand treatment and forms an accurate evaporated pattern.

Fifth Embodiment

Figure 9A:
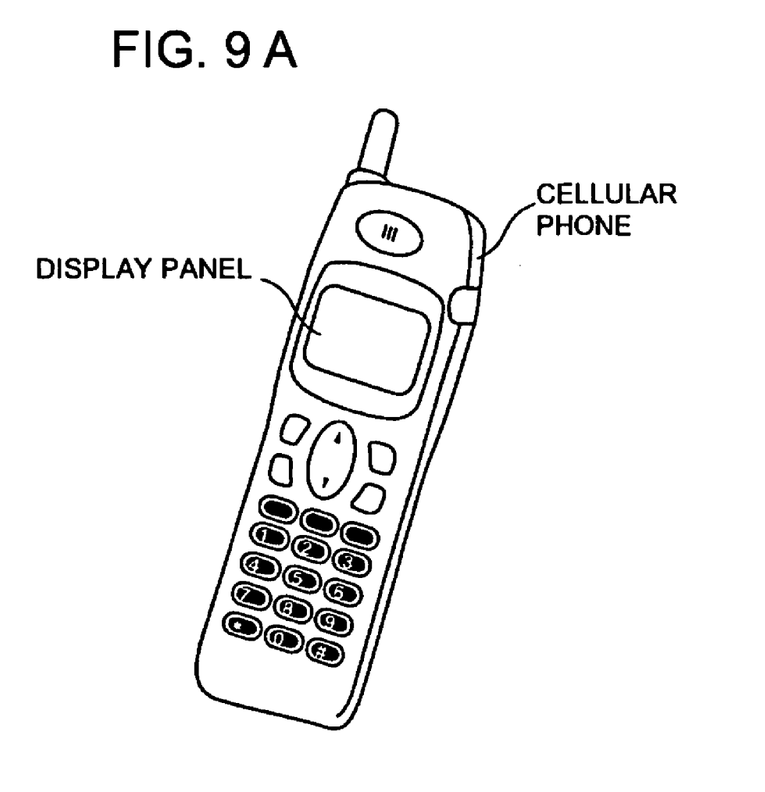
FIGS. 9A and 9B are diagrams showing electronic equipment according to a fifth embodiment of the invention.
Figure 9B:
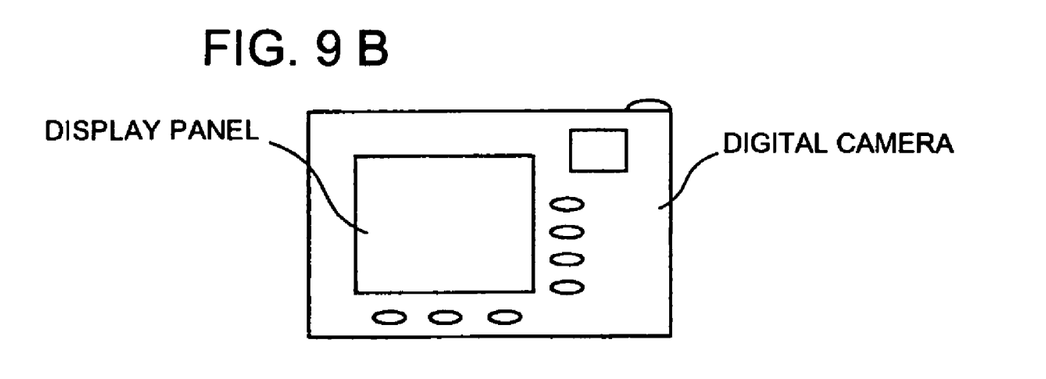

FIG. 9 is a diagram showing electronic equipment according to a fifth embodiment of the invention. FIG. 9A shows an example of the EL display according to the invention used as a display panel of a cellular phone. FIG. 9B shows an example of the EL display according to the invention used as a display panel of a digital panel. Other examples in which the EL display according to the invention can be used as a display include game machines and computers.

The entire disclosure of Japanese Patent Application No. 2003-011451 filed Jan. 20, 2003 is incorporated by reference.

What is claimed is:

1. A precision mask for deposition, comprising:
a first brace including a plurlaity of sections parallel to each other at given intervals, the first brace forming portions that define a plurality of first openings;
a second brace on the first brace and intersecting with the first brace;
the second brace forming portions that define a plurality of second openings; and
the second brace being joined to the first brace at a point where the second brace intersects the first brace.

2. The precision mask for deposition according to claim 1, further comprising:
a mask substrate;
wherein the first brace and the second brace are joined to the mask substrate.

3. The precision mask for deposition according to claim 2, wherein the mask substrate comprises single crystal silicon.

4. The precision mask for deposition according to claim 3, wherein at least one of side surfaces of the first brace and side surfaces of the second brace is of surface orientation (111).

5. The precision mask for deposition according to claim 3, wherein the mask substrate comprises single crystal silicon of surface orientation (110);
side surfaces of the first brace are perpendicular (111) to surface orientation (110) of the mask substrate; and
side surfaces of the second brace are perpendicular (111) to surface orientation (110) of the mask substrate.

6. The precision mask for deposition according to claim 3, wherein the mask substrate comprises single crystal silicon having an oxygen concentration of $1.7*10^{18}$ atm/cm$^3$ or below.

7. A precision mask for deposition, comprising:
a first brace including a plurality of first spaced apart parallel ribs defining a plurality of first openings; and
a second brace including a plurality of second spaced apart parallel ribs defining a plurality of second openings, the first brace being joined to the second brace where the first ribs intersect the second ribs.

* * * * *